(12) United States Patent
Khandelwal et al.

(10) Patent No.: US 11,622,461 B2
(45) Date of Patent: Apr. 4, 2023

(54) SEALING FOR AN INTERMITTENT AND PARTIAL ROTATING AND TRANSLATING SHAFT

(71) Applicant: Eaton Intelligent Power Limited, Dublin (IE)

(72) Inventors: Apurv Khandelwal, Aurangabad (IN); Nikhil Tilakpure, Jalgaon (IN); Vijay Kumar, Kolkata (IN); Marcel Berend Paul van Dijk, Enschede (NL); Anand Sattappa Chiman, Pune (IN); Madhura Damodar Aradhye, Aurangabad (IN)

(73) Assignee: EATON INTELLIGENT POWER LIMITED, Dublin (IE)

( * ) Notice: Subject to any disclaimer, the term of this patent is extended or adjusted under 35 U.S.C. 154(b) by 0 days.

(21) Appl. No.: 17/227,394

(22) Filed: Apr. 12, 2021

(65) Prior Publication Data
US 2021/0321523 A1    Oct. 14, 2021

(30) Foreign Application Priority Data

Apr. 14, 2020   (IN) .............................. 202011016141
Jun. 2, 2020    (GB) ..................................... 2008265

(51) Int. Cl.
*H05K 5/06*       (2006.01)
*H01H 33/56*      (2006.01)
(Continued)

(52) U.S. Cl.
CPC ............. *H05K 5/061* (2013.01); *H01H 33/02* (2013.01); *H01H 33/565* (2013.01);
(Continued)

(58) Field of Classification Search
CPC . H01H 33/66238; H01H 33/565; H05K 5/061
See application file for complete search history.

(56) References Cited

U.S. PATENT DOCUMENTS 4,528,432 A * 7/1985 Senba .............. H01H 33/66207
                                                    218/135
4,730,231 A * 3/1988 Tanigaki ................ H02B 11/26
                                                    361/612
(Continued)

FOREIGN PATENT DOCUMENTS

CN        109148212 A     1/2019
DE          2755675 A1    6/1979
(Continued)

OTHER PUBLICATIONS

Gland Design; Packings, Hydraulic, General Requirements for (Military Specification), MIL-G-5514G, Nov. 1, 1993, 23 pages (Year: 1993).*

*Primary Examiner* — Robert J Hoffberg
(74) *Attorney, Agent, or Firm* — Leydig, Voit & Mayer, Ltd.

(57) ABSTRACT

A gas insulated switchgear includes: a gas-tight housing; at least one shaft extending through an opening in the gas-tight housing, which shaft is partially rotatable and/or translatable; a sealing means arranged in the opening for sealing the shaft relative to the gas-tight housing, the sealing means including a sealing bellows having a first mounting rim on one axial end, a second mounting rim on an other axial end, and a bellow body in between the first and second mounting rims; and a mounting ring mounted coaxially to the shaft. The sealing bellows is arranged around the shaft, with the first mounting rim to the housing and with the second mounting rim to the mounting ring.

12 Claims, 2 Drawing Sheets

(51) Int. Cl.
  *H02B 13/045*  (2006.01)
  *H02B 1/26*  (2006.01)
  *H02B 13/00*  (2006.01)
  *H01H 33/662*  (2006.01)
  *H01H 33/02*  (2006.01)

(52) U.S. Cl.
  CPC ......... *H01H 33/66238* (2013.01); *H02B 1/26* (2013.01); *H02B 13/00* (2013.01); *H02B 13/045* (2013.01)

(56) References Cited

U.S. PATENT DOCUMENTS

| | | |
|---|---|---|
| 6,114,647 A | 9/2000 | Hashimoto et al. |
| 8,008,594 B2 * | 8/2011 | Kurogi ............... H02B 13/0354 218/119 |
| 10,748,723 B2 * | 8/2020 | Jaenicke ................ H01H 33/56 |

FOREIGN PATENT DOCUMENTS

| | | | |
|---|---|---|---|
| EP | 0852386 A1 | 7/1998 | |
| EP | 2073234 A1 * | 6/2009 | ....... H01H 33/66238 |
| JP | 2004064900 A | 2/2004 | |

\* cited by examiner

SEALING FOR AN INTERMITTENT AND PARTIAL ROTATING AND TRANSLATING SHAFT

CROSS-REFERENCE TO PRIOR APPLICATION

Priority is claimed to British Patent Application No. GB 2008265.7, filed on Jun. 2, 2020, and to Indian Patent Application No. IN 202011016141, filed on Apr. 14, 2020. The entire disclosure of both applications is hereby incorporated by reference herein.

FIELD

The invention relates to a gas insulated switchgear, such as circuit-breakers and disconnectors, comprising:
a gas-tight housing;
at least one shaft extending through an opening in the gas-tight housing, which shaft is partially rotatable and/or translatable; and
sealing means arranged in the opening for sealing the shaft relative to the gas-tight housing.

BACKGROUND

In gas insulated switchgear, there is a gas tight tank with a gas, such as air, sulfur hexafluoride or another electrical insulating gas, which is expected to be sealed for life, which is typically over 30 years.

Typically, switchgear has both static and dynamic seals. The dynamic seals allow for an axial and/or rotational movement of a shaft extending from the housing, while maintaining the gas-tightness of the housing. All those seals have stringent requirements for arresting the gas leakage.

In known gas insulated switchgear lip seals are used, which allow for the shaft to axially move and rotate relative to the lip seal, while maintaining gas-tightness. However, due to the stringent requirements, such lip seals have to meet high standards and are therefore costly.

SUMMARY

In an embodiment, the present invention provides a gas insulated switchgear, comprising: a gas-tight housing; at least one shaft extending through an opening in the gas-tight housing, which shaft is partially rotatable and/or translatable; a sealing means arranged in the opening configured to seal the shaft relative to the gas-tight housing, the sealing means comprising a sealing bellows having a first mounting rim on one axial end, a second mounting rim on an other axial end, and a bellow body in between the first and second mounting rims; and a mounting ring mounted coaxially to the shaft, wherein the sealing bellows is arranged around the shaft, with the first mounting rim to the housing and with the second mounting rim to the mounting ring.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

Figure 1:
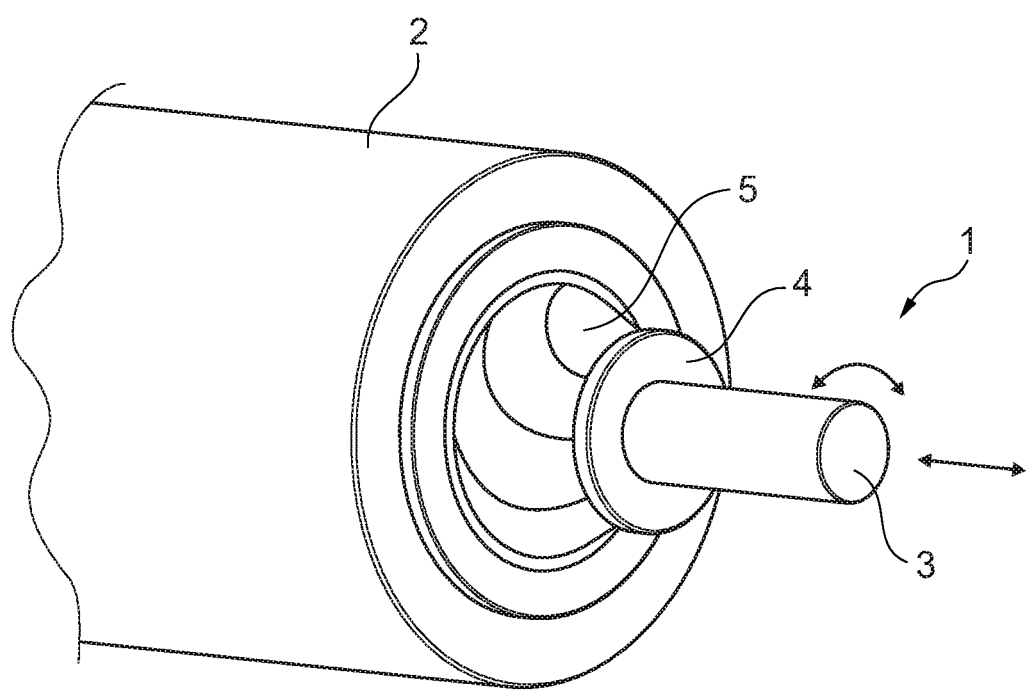
FIG. 1 shows a perspective view of an embodiment of the gas insulated switchgear according to the invention.

In an embodiment, the present invention provides an alternative sealing, which is preferably more cost effective.

In an embodiment, the present invention provides a gas insulated switchgear as described herein, which is characterized in that the sealing means comprise a sealing bellows having a first mounting rim on one axial end, a second mounting rim on the other axial end and a bellow body in between the first and second mounting rims, wherein a mounting ring is mounted coaxially to the shaft and wherein the sealing bellows is arranged around the shaft and with the first mounting rim to the housing and with the second mounting rim to the mounting ring.

A sealing bellows allows for axial/rotational movement of the shaft relative to the housing, without any sliding movement between parts, in particular seals. The mounting ring is mounted on the shaft and can remain stationary relative to the shaft, while the sealing bellows takes up the relative movement by deformation of the bellow body. Also, partial rotation of the shaft can be accommodated by the bellow body by twisting the bellow body.

With the gas insulated switchgear according to the invention, no relative sliding is present over any sealing interface, such as is the case with lip seals. This allows for a single component design, which is cost effective.

In a preferred embodiment of the gas insulated switchgear according to the invention the bellow body is cone shaped and made of flexible material, in particular a soft polymer, in order to allow twisting, compression and expansion of the bellow body around the shaft.

A cone shaped bellow body can easily take up axial displacements, rotational movement or both. The cone shaped wall of the bellow body will buckle inwardly or stretch out when the shaft is axially displaced.

In a further preferred embodiment of the gas insulated switchgear according to the invention the bellow body has a corrugated shape with undulations to guide the twisting, compression and expansion of the bellow body.

Using a corrugated shape with undulations will allow the bellow body to deform in a controlled way.

Preferably, the undulations extend along the surface of the bellow body and have a tangential and axial direction component, in particular a helical direction.

With such undulations the bellow body can be controlled to twist, when the shaft displaces axially or rotates. A further advantage is that the bellow body can be designed to have additional strength at locations around the bellow body, which are stressed more than other locations around the bellow body.

In another embodiment of the gas insulated switchgear according to the invention the mounting ring is provided with a circumferential groove arranged in the inner edge of the mounting ring, and wherein a seal, in particular an O-ring, is arranged in the circumferential groove and in sealing contact with the shaft.

By arranging the mounting ring with an O-ring onto the shaft, a good sealing of the mounting ring with respect to the shaft is obtained, while the sealing means can be easily disassembled.

In a further embodiment of the gas insulated switchgear according to the invention a first clamping ring is mounted to the gas-tight housing and the first mounting rim is arranged between the gas-tight housing and the first clamping ring.

Preferably, a sealing, in particular an O-ring, is provided between the first mounting rim and the gas-tight housing, and radially inside of the mounting, such as a number of bolts, of the first clamping ring.

The first clamping ring contributes to the possibility of easily assembling and disassembling the sealing means. It furthermore ensures that an evenly distributed clamping force is exerted by the first clamping ring on the first mounting rim, which contributes to a reliable gas-tight switchgear.

In yet another embodiment of gas insulated switchgear according to the invention a second clamping ring is mounted to the mounting ring and the second mounting rim is arranged between the mounting ring and the second clamping ring.

Again preferred is when a sealing, in particular an O-ring, is provided between the second mounting rim and the mounting ring, and radially inside of the mounting, such as a number of bolts, of the second clamping ring.

The second clamping ring also contributes to an easier assembly and disassembly of the sealing means of the gas insulated switchgear.

These and other features of the invention will be elucidated in conjunction with the accompanying drawings.

FIG. 1 shows a perspective view of an embodiment of the gas insulated switchgear according to the invention.

Figure 2:
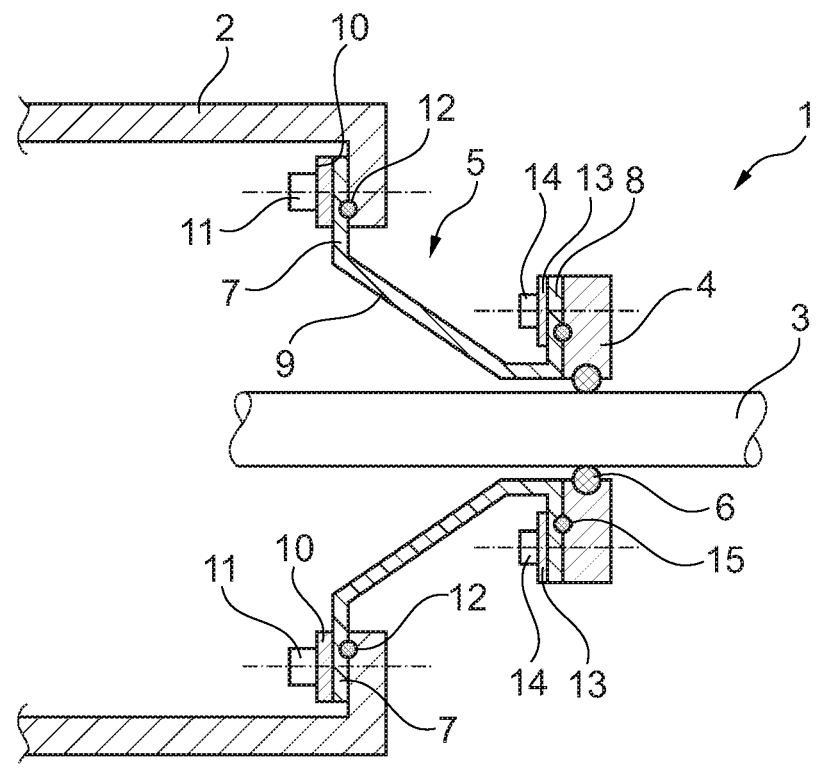
FIG. 2 shows a cross-sectional view of the embodiment of FIG. 1.

FIG. 2 shows a cross-sectional view of the embodiment of FIG. 1.

Figure 3:
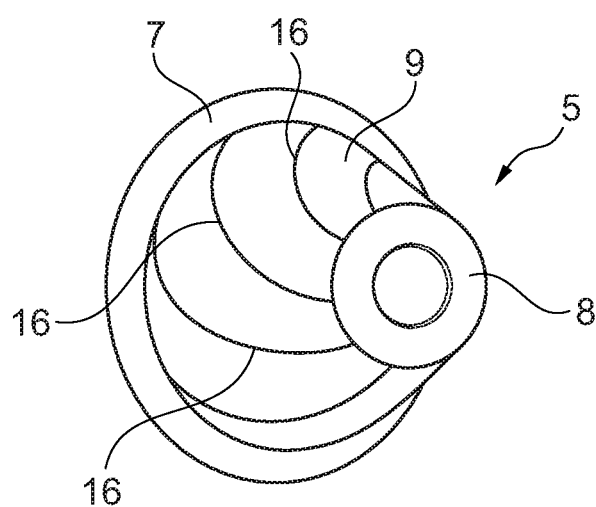
FIG. 3 shows a more detailed view of the sealing bellows for the embodiment of FIG. 1.

FIG. 3 shows a more detailed view of the sealing bellows for the embodiment of FIG. 1.

FIG. 1 shows an embodiment 1 of a gas insulated switchgear according to the invention. The embodiment 1 has a gas-tight housing 2 with a shaft 3, which is movable in axial direction and can be rotated over a small angle of for example 0°-180°.

A mounting ring 4 is arranged stationary on the shaft 3 and a sealing bellows 5 is mounted between the housing 2 and the shaft 3 to allow rotation and axial movement of the shaft 3, while maintaining gas-tightness.

FIG. 2 shows a cross-section of the embodiment 1 according to FIG. 1. The mounting ring 4 has a circumferential groove arranged in the inner edge of the mounting ring 4, in which an O-ring 6 is arranged. The O-ring 6 provides a seal between the mounting ring 4 and the shaft 3 as well as ensures that the mounting ring 4 remains stationary relative to the shaft 3.

The sealing bellows 5, which is shown in more detail in FIG. 3, has a first mounting rim 7 on one end, a second mounting rim 8 on the other end and a bellows body 9 in between both mounting rims.

The first mounting rim 7 is clamped between a first clamping ring 10 and the housing 2 by a number of bolts 11. An O-ring 12 is provided between the first mounting rim 7 and the housing 2 to ensure a reliable gas tightness.

The second mounting rim 8 is clamped between a second clamping ring 13 and the mounting ring 4 by bolts 14. An O-ring 15 is provided between the second mounting rim 8 and the mounting ring 4 to ensure gas tightness at this end.

The sealing bellows 5 has undulations 16, which have a helical shape and run along the circumference of the corrugated shaped bellows body 9.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. A gas insulated switchgear, comprising:
   a gas-tight housing;
   at least one shaft extending through an opening in the gas-tight housing, the at least one shaft being partially rotatable and/or translatable;
   a sealing bellows having a first mounting rim on one axial end, a second mounting rim on an other axial end, and a bellow body connecting the first and second mounting rims, the sealing bellows being at least partially arranged in the opening; and
   a mounting ring mounted coaxially to the at least one shaft,
   wherein the sealing bellows is arranged around the at least one shaft, with the first mounting rim attached to an inside surface of a side wall of the gas-tight housing and with the second mounting rim attached to the mounting ring.

2. The gas insulated switchgear of claim 1, wherein the bellow body is cone shaped and comprises a flexible material in order to allow twisting, compression, and expansion of the bellow body around the at least one shaft.

3. The gas insulated switchgear of claim 2, wherein the bellow body has a corrugated shape with undulations to guide the twisting, compression, and expansion of the bellow body.

4. The gas insulated switchgear of claim 3, wherein the undulations extend along a surface of the bellow body and have a tangential and axial direction component comprising a helical direction.

5. The gas insulated switchgear of claim 2, wherein the flexible material comprises a soft polymer.

6. The gas insulated switchgear of claim 1, wherein the mounting ring comprises a circumferential groove arranged in an inner edge of the mounting ring, and
   wherein a seal comprising an O-ring is arranged in the circumferential groove and in sealing contact with the at least one shaft.

7. The gas insulated switchgear of claim 1, further comprising:
a first clamping ring mounted to the gas-tight housing, wherein the first mounting rim is arranged between the gas-tight housing and the first clamping ring.

8. The gas insulated switchgear of claim 7, further comprising:
a seal, comprising an O-ring, provided between the first mounting rim and the gas-tight housing, and radially inside of a mounting, comprising a number of bolts, of the first clamping ring.

9. The gas insulated switchgear of claim 7, further comprising:
a second clamping ring mounted to the mounting ring, wherein the second mounting rim is arranged between the mounting ring and the second clamping ring.

10. The gas insulated switchgear of claim 9, further comprising: a seal, comprising an O-ring, provided between the second mounting rim and the mounting ring, and radially inside of a mounting, comprising a number of bolts, of the second clamping ring.

11. The gas insulated switchgear of claim 1, wherein the gas-tight housing comprises a longitudinal wall and the side wall, the longitudinal wall and the side wall at least partially encompassing an interior of the gas-tight housing, wherein the opening in the gas-tight housing is an opening in the side wall, and wherein the at least one shaft axially extends from the interior of the gas-tight housing, through the opening in the side wall, and out of the gas-tight housing.

12. The gas insulated switchgear of claim 11, wherein the mounting ring surrounds a portion of the shaft that is external to the gas-tight housing, and wherein the sealing bellows extends, from the interior of the gas-tight housing, through the opening in the side wall, and out of the gas-tight housing.

* * * * *